(12) United States Patent
Liu

(10) Patent No.: US 6,972,455 B2
(45) Date of Patent: Dec. 6, 2005

(54) FLASH MEMORY STRUCTURE AND MANUFACTURING METHOD THEREOF

(75) Inventor: Han-Hsing Liu, Hsinchu (TW)

(73) Assignee: Winbond Electronics Corporation, (TW)

( * ) Notice: Subject to any disclaimer, the term of this patent is extended or adjusted under 35 U.S.C. 154(b) by 0 days.

(21) Appl. No.: 10/744,155

(22) Filed: Dec. 22, 2003

(65) Prior Publication Data

US 2004/0159878 A1 Aug. 19, 2004

(30) Foreign Application Priority Data

Dec. 24, 2002 (TW) .............................. 91137215 A

(51) Int. Cl.⁷ .......................................... H01L 29/788

(52) U.S. Cl. ................. 257/315; 257/316; 257/317; 257/318; 257/319; 438/201; 438/211; 438/257

(58) Field of Search ................. 257/315–319, 257/320, 326, 314; 438/201, 211, 257, 260, 438/262–264

(56) References Cited

U.S. PATENT DOCUMENTS 6,153,904 A * 11/2000 Yang .......................... 257/316

* cited by examiner

Primary Examiner—Donghee Kang

(57) ABSTRACT

A flash memory structure having high coupling ratio and the manufacturing method thereof are provided. The manufacturing method includes the following steps of method of a flash memory having high coupling ratio, including steps of providing a substrate, forming a first isolation structure and a second isolation structure upon the substrate, forming a gate electrode upon the substrate between the first isolation structure and the second isolation structure, to then further cover parts of the first isolation structure and the second isolation structure, removing parts of the first isolation structure and the second isolation structure uncovered by the gate electrode for a specific range, forming a first silicon layer upon the gate electrode, the first isolation structure and the second isolation structure, removing parts of the first silicon layer to expose the gate electrode and parts of the first isolation structure and the second isolation structure for forming a flash memory floating gate structure having sidewalls, forming a dielectric layer upon the floating gate structure, and forming a second silicon layer upon the dielectric layer.

4 Claims, 3 Drawing Sheets

FLASH MEMORY STRUCTURE AND MANUFACTURING METHOD THEREOF

CROSS REFERENCE TO PRIOR APPLICATION

This application claims priority to a Patent Application filed in Taiwan, R.O.C., having application number 091137215, filed Dec. 24, 2002, entitled "Flash Memory Structure and Manufacturing Method Thereof". This priority claim is made under 35 U.S.C. 119, as per an agreement signed between the United States and Taiwan on Apr. 10, 1996.

FIELD OF THE INVENTION

This invention relates to a semiconductor device and the manufacturing method thereof and more particularly to a flash memory device having high coupling ratio and the manufacturing method thereof, which could be applied to an erasable programmable read-only memory (EPROM).

BACKGROUND OF THE INVENTION

As the amazing progress in the technology of semiconductor device process in these years, the products must be light and handy, thin and have small superficial area to meet the needs of the market. So the flash memory devices which have the above features are broadly applied to be the major nonvolatilememory products. The future tendency of the manufacturing technique for the flash memory is the same as the other semiconductor devices. All of them tend to be of high density, low power dissipation, low cost and high efficiency etc. The design of an advanced flash memory device is concerned with the threshold voltage transfer, the data write-in efficiency and the wiper rate etc., such that the reliability, functions and integration could be promoted.

The trend of the ultra-large-scale digital integrated circuits (ULSI) is towards to the rapid manufacturing process and the lower voltage supply, but the manufacturing technique for the flash memory is more conscientious and careful. The goal of the manufacturing technique for a flash memory is to achieve the high coupling ratio. Generally, the coupling ratio is raised by increasing the contact area between the control gate and the floating gate. Therefore, the chief method is to efficiently increase the floating area. Please refer to FIG. 1 (a). The floating gate 111 is extended to the horizontal sides for increasing the contact surface area with the control gate 112. But this method unavoidably increases the cell area size. The way to produce a light and handy, thin and small size semiconductor device is the goal that people always strive for. It will be put the cart before the horse if we abandon the original goal just for enhancing the high coupling ratio.

As the problems described above, a solution is proposed by the industry. Please refer to FIG. 1 (b). The floating gate 121 is vertically extended. An oxide-on-nitride-on-oxide layer 122 is formed on floating gate 121. It could increase the contact surface area with the control gate 123 because the oxide-on-nitride-on-oxide layer 122 is curve. However, the curved design of the oxide-on-nitride-on-oxide layer leads to the presence of leakage current in the curved loophole. Besides that, the vertical formation of the floating gate 111 will produce a deposition problem afterwards as well.

Because of the technical defects described above, the applicant keeps on carving unflaggingly to develop "flash memory structure and manufacturing method thereof" through wholehearted experience and research.

SUMMARY OF THE INVENTION

It is an object of the present invention to provide a manufacturing method of a flash memory having high coupling ratio, including steps of providing a substrate, forming a first isolation structure and a second isolation structure upon the substrate, forming a gate electrode upon the substrate between the first isolation structure and the second isolation structure, to then further cover parts of the first isolation structure and the second isolation structure, removing parts of the first isolation structure and the second isolation structure uncovered by the gate electrode for a specific range, forming a first silicon layer upon the gate electrode, the first isolation structure and the second isolation structure, which the first silicon layer is a polysilicon layer, an amorphous silicon layer or a silicide layer, removing parts of the first silicon layer to expose the gate electrode and parts of the first isolation structure and the second isolation structure to form a flash memory floating gate structure having sidewalls, forming a dielectric layer upon the floating gate structure, and forming a second silicon layer upon the dielectric layer in which the second silicon layer is a polysilicon layer or an amorphous silicon layer or a silicide layer.

Preferably, the first isolation structure and the second isolation structure are formed by means of a shallow trench isolation (STI) method.

Preferably, the first isolation structure and the second isolation structure are formed by means of a localized oxidation isolation (LOCOS) method.

Preferably, the gate electrode is formed by means of a chemical vapor deposition (CVD).

Preferably, the isolation structure uncovered by the gate electrode is removed by means of a lithograph method.

Preferably, the isolation structure uncovered by the gate electrode is removed by means of an etching method.

Preferably, the specific range has a depth ranged from 500 to 2000 A.

Preferably, the first silicon layer is formed by means of a chemical vapor deposition (CVD).

Preferably, the first silicon layer is an amorphous silicon layer.

Preferably, the flash memory floating gate structure is defined by an anisotropic dry etching.

Preferably, the second silicon layer is formed by means of a low pressure chemical vapor deposition (LPCVD).

Preferably, the dielectric layer is formed by means of a low pressure chemical vapor deposition (LPCVD).

Preferably, the dielectric layer is an oxide-on-nitride-on-oxide (ONO).

Preferably, the second silicon layer is an amorphous silicon layer.

Preferably, the first silicon layer is a silicide layer.

It is an another object of the present invention to provide a manufacturing method of a flash memory floating gate, including steps of providing a substrate, forming a first isolation structure and a second isolation structure upon the substrate, forming a gate electrode upon the substrate between the first isolation structure and the second isolation structure, to then further cover parts of the first isolation structure and the second isolation structure, removing parts of the first isolation structure and the second isolation structure uncovered by the gate electrode for a specific range, forming a first silicon layer upon the gate electrode, the first isolation structure and the second isolation structure, which the first silicon layer is a polysilicon layer or an amorphous silicon layer or a silicide layer, and removing parts of the first silicon layer to expose the gate electrode and parts of the first isolation structure and the second isolation structure for forming a flash memory floating gate structure having sidewalls.

Preferably, the first isolation structure and the second isolation structure are formed by means of a shallow trench isolation (STI) method.

Preferably, the first isolation structure and the second isolation structure are formed by means of localized oxidation isolation (LOCOS) method.

Preferably, the gate electrode is formed by means of a chemical vapor deposition (CVD).

Preferably, the isolation structure uncovered by the gate electrode is removed by means of a lithograph method.

Preferably, the isolation structure uncovered by the gate electrode is removed by means of an etching method.

Preferably, the first silicon layer is a polysilicon layer.

Preferably, the first silicon layer is an amorphous silicon layer.

Preferably, the first silicon layer is a silicide layer.

Preferably, the flash memory floating gate structure is defined by means of an anisotropic dry etching.

It is an another object of the present invention to provide a flash memory floating gate structure having high coupling ratio, including: a substrate; a first isolation structure and a second isolation structure formed upon the substrate and having a first and a second lateral sites respectively; a gate electrode formed upon the substrate, for covering parts of the first isolation structure and the second isolation structure but exposing the first and the second lateral sites; and an sidewall structure disposed on the first and the second lateral sites of the first isolation structure, the second isolation structure and the gate structure.

Preferably, the flash memory floating gate structure is defined by means of an anisotropic dry etching.

Another aspect, character and executive adduction of the present invention will become more completely comprehensible by the following revelation and accompanying claim.

DETAILED DESCRIPTION OF THE PREFERRED EMBODIMENT

The present invention provides a manufacturing method of a flash memory having high coupling ratio. Please refer to FIGS. 2(a) to 2(g) showing the schematic diagrams of the flash memory of a preferred embodiment. The detailed steps of the manufacturing method are described as follows.

At first, a substrate 21 is provides. A shallow trench isolation method (STI) is used to form a first isolation structure 22 and a second isolation structure 23 upon the substrate 21 separately. The first isolation structure 22 and the second isolation structure 23 are further extruded out of the substrate 21 (as shown in FIG. 2 (a)). A localized oxidation isolation method (LOCOS) could be used to form the isolation structure described above.

Figure 1A:
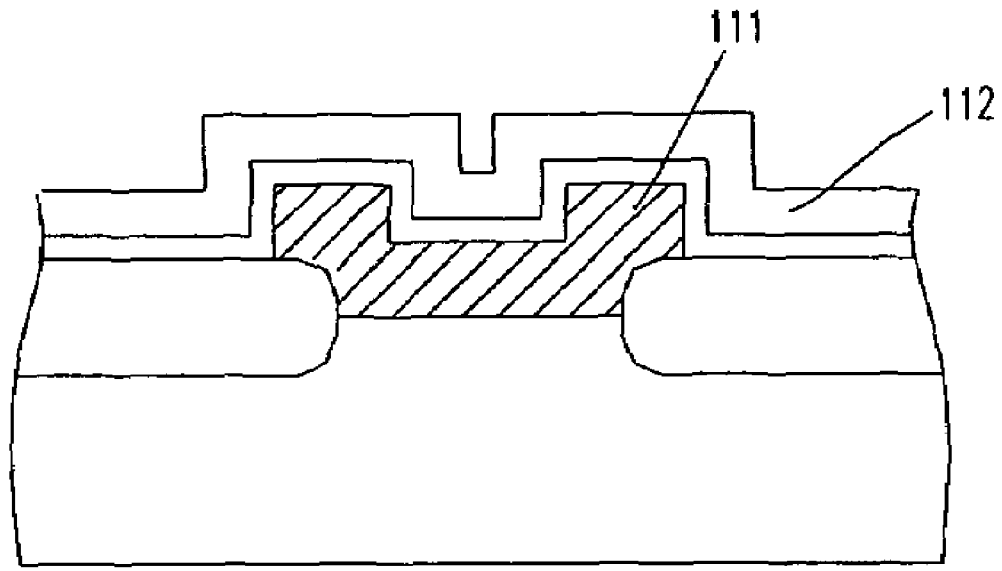
FIGS. 1(a) to (b) show a schematic diagram of a flash memory device according to prior arts.
Figure 1B:
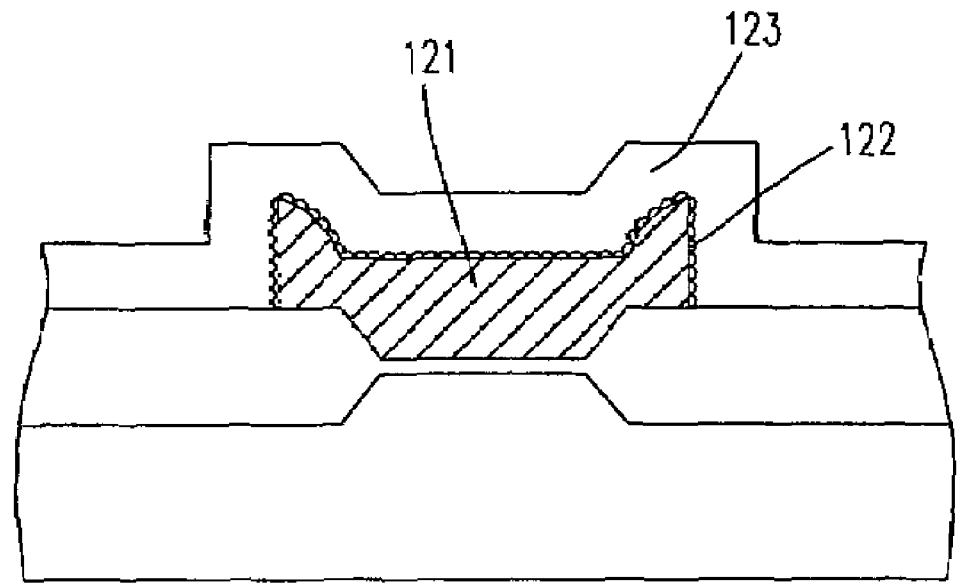
Figure 2A:
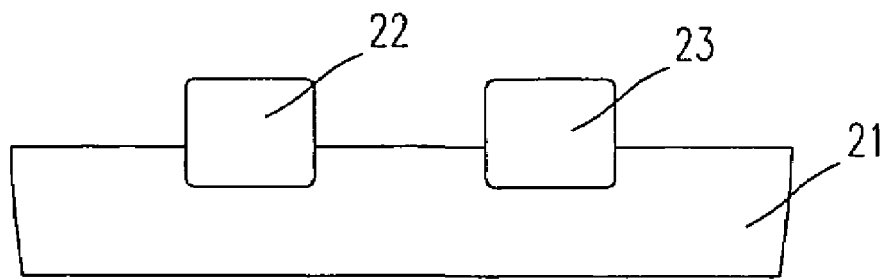
FIGS. 2 (a) to (g) show the schematic diagrams of a flash memory according to a preferred embodiment of the present invention.
Figure 2B:
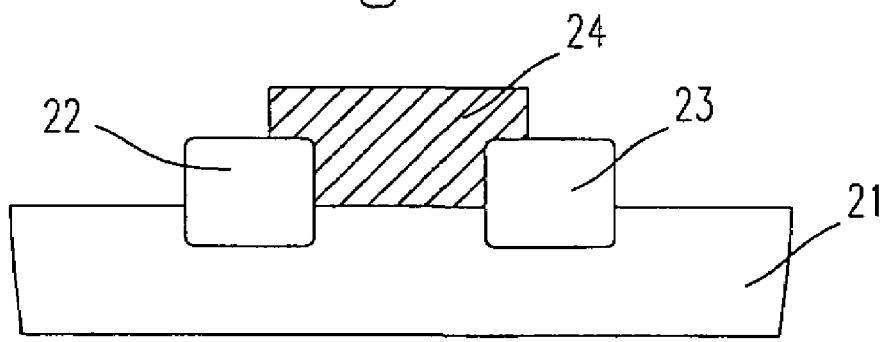
Figure 2C:
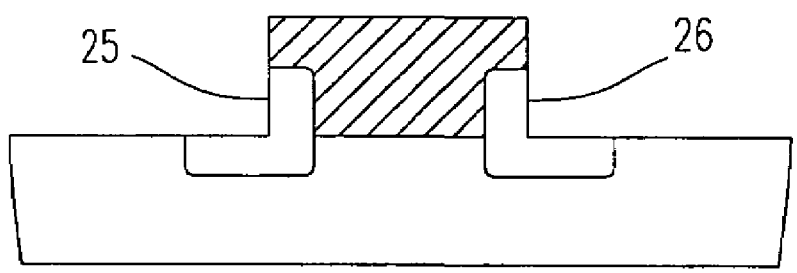

And then, a chemical vapor deposition (CVD) is used to form a gate electrode 24 upon the substrate 21 between the first isolation structure 22 and the second isolation structure 23, to then further cover parts of the first isolation structure 22 and the second isolation structure 23 (as shown in FIG. 2(b)). Parts of the first isolation structure 22 and the second isolation structure 23 uncovered by the gate electrode 24 are removed by means of a lithograph method and an etching method for a specific range from 500 to 2000 A. A first lateral site 25 and a second lateral site 26 are formed separately (as shown in FIG. 2(c)).

Figure 2D:
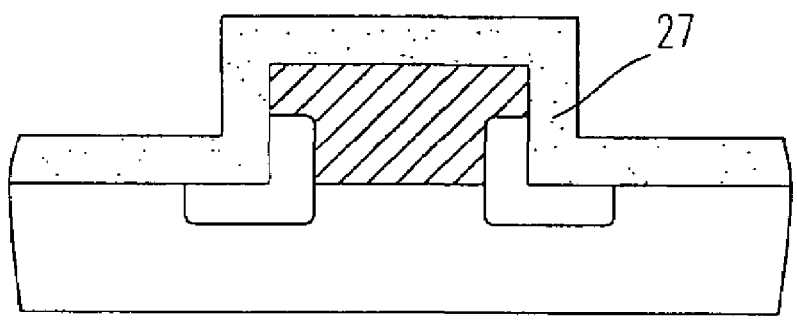

A chemical vapor deposition (CVD) is used to form a first silicon layer 27 upon the gate electrode 24, the first isolation structure 22 and the second isolation structure 23, which the first silicon layer 27 is a polysilicon layer or an amorphous silicon layer or a silicide layer, (as shown in FIG. 2(d)). Then, an anisotropic dry etching is used to remove the contact crosspieces between the first silicon layer and the gate electrode, between the first silicon layer and the first isolation structure and between the first silicon layer and the second isolation structure to expose parts of the surface of the first isolation structure 22 and the second isolation structure 23. So the first sidewall 28 and the second sidewall 29 are formed. The first sidewall 28, the second sidewall 29 and the gate electrode 24 could be the floating gates of the flash memory device (as shown in FIG. 2 (e)).

Figure 2E:
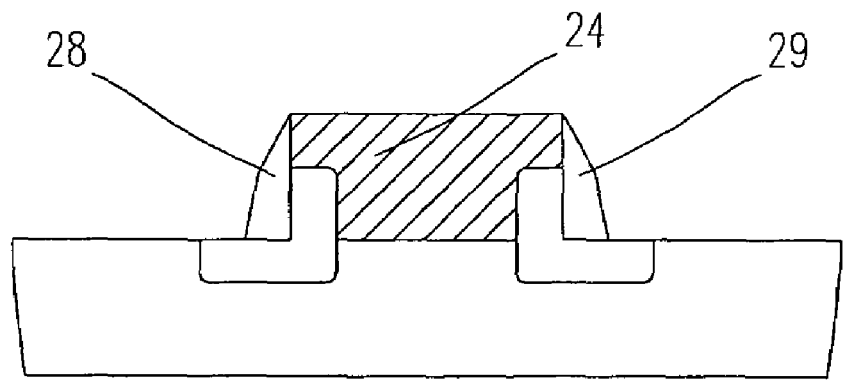
Figure 2F:
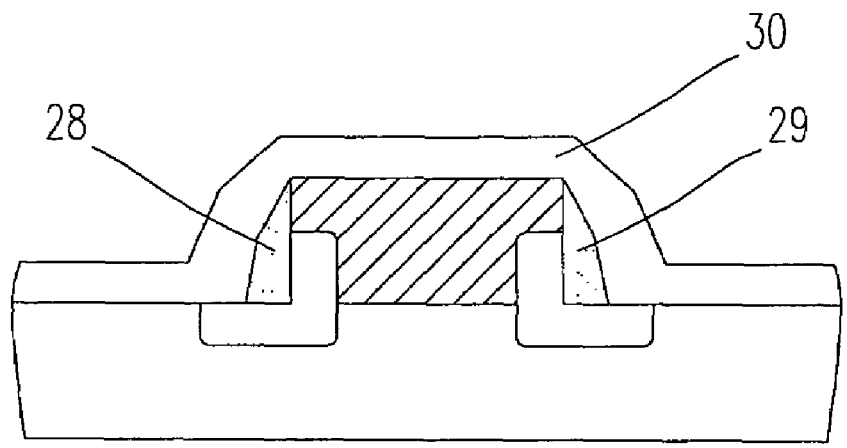
Figure 2G:
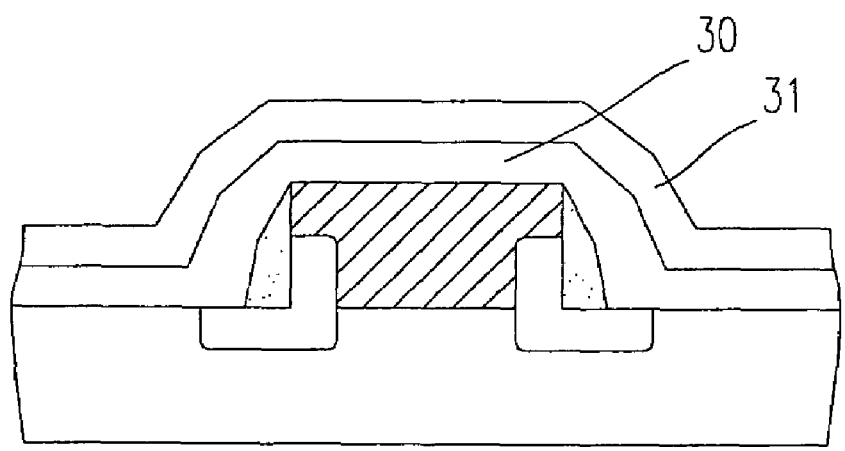

Finally, a dielectric layer 20 and the second silicon layer 31 are separately formed upon the floating gates 24, 28, and 29 by means of the chemical vapor deposition (CVD) (as shown in FIGS. 2(e) and (f)). The second silicon layer 31 is a polysilicon layer, an amorphous silicon layer or a suicide layer, and could be the control gate layer of the flash memory. The dielectric layer 30 is an oxide-on-nitride-oxide (ONO) layer preferably.

The first and the second silicon layers could be formed by different material. The material includes recrystalized amorphous, polysilicon, silicide and other conductive material etc.

As described above, the floating gate layer of the present invention having the first sidewall and the second sidewall could increase the contact area with the control gate layer. The coupling ratio could be enhanced. Because of the reasons described above, the present invention provides the substantially preferred aids for industrial development.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flash memory floating gate structure having high coupling ratio, comprising:
   a substrate;
   a first isolation structure and a second isolation structure formed upon said substrate and having a first and a second lateral sites respectively;
   a first gate electrode formed upon said substrate and between said first isolation structure and said second isolation structure, for covering parts of said first isolation structure and said second isolation structure but exposing said first and said second lateral sites; and a second gate electrode disposed on said first and said second lateral sites of both said first isolation structure and said second isolation structure and a lateral site of said first gate electrode, wherein said first gate electrode and said second gate electrode form a floating gate structure.

2. The structure as claimed in claim 1, wherein said flash memory floating gate structure is defined by means of an anisotropic dry etching.

3. The structure as claimed in claim 1, wherein said first isolation structure and said second isolation structure are formed by means of a shallow trench isolation (STI) method.

4. The structure as claimed in claim 1, wherein said first isolation structure and said second isolation structure are formed by means of a localized oxidation isolation (LOCOS) method.

* * * * *